US010735096B2

(12) United States Patent
Shi et al.

(10) Patent No.: US 10,735,096 B2
(45) Date of Patent: Aug. 4, 2020

(54) REMOTE RADIO APPARATUS AND COMPONENT THEREOF

(71) Applicant: HUAWEI TECHNOLOGIES CO., LTD., Shenzhen, Guangdong (CN)

(72) Inventors: Xiaoming Shi, Shanghai (CN); Xiaohui Shen, Shenzhen (CN); Dan Liang, Shanghai (CN); Haigang Xiong, Shenzhen (CN); Haizheng Tang, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/516,515

(22) Filed: Jul. 19, 2019

(65) Prior Publication Data

US 2019/0342007 A1    Nov. 7, 2019

Related U.S. Application Data

(63) Continuation of application No. 16/002,608, filed on Jun. 7, 2018, now Pat. No. 10,361,784, which is a
(Continued)

(30) Foreign Application Priority Data

Dec. 8, 2015  (CN) .......................... 2015 1 0896866
Dec. 8, 2015  (CN) ...................... 2015 2 1010074 U

(51) Int. Cl.
*H04B 10/2575* (2013.01)
*H05K 7/20* (2006.01)

(52) U.S. Cl.
CPC ......... *H04B 10/25753* (2013.01); *H05K 7/20* (2013.01); *H05K 7/20145* (2013.01); *H05K 7/20163* (2013.01)

(58) Field of Classification Search
CPC ............................................... H04B 10/25753
See application file for complete search history.

(56) References Cited

U.S. PATENT DOCUMENTS

| 2007/0036101 A1 | 2/2007 | Chen et al. |
| 2010/0129035 A1 | 5/2010 | Teo |
| 2016/0198586 A1 | 7/2016 | Bouda |

FOREIGN PATENT DOCUMENTS

| CN | 2812449 | 8/2006 |
| CN | 101546853 | 9/2009 |

(Continued)

OTHER PUBLICATIONS

Extended European Search Report issued in European Application No. 16872389.8 dated Sep. 25, 2018, 6 pages.
(Continued)

*Primary Examiner* — Mukundbhai G Patel
(74) *Attorney, Agent, or Firm* — Fish & Richardson P.C.

(57) ABSTRACT

An example remote radio apparatus is provided, including a body, a mainboard, a mainboard heat sink, a maintenance cavity, an optical module, and an optical module heat sink. The maintenance cavity and the optical module heat sink are integrally connected, while the optical module is mounted on a bottom surface of the optical module heat sink. The maintenance cavity and the optical module heat sink are mounted on a side surface of the body, and the mainboard heat sink is mounted on and covers the mainboard. The mainboard heat sink and the mainboard are installed on a front surface of the body, and the mainboard heat sink and the optical module heat sink are spaced by a preset distance. The temperature of the optical module is controlled within a range required by a specification.

15 Claims, 4 Drawing Sheets

Related U.S. Application Data continuation of application No. PCT/CN2016/108867, filed on Dec. 7, 2016.

(56) References Cited

FOREIGN PATENT DOCUMENTS

| | | |
|---|---|---|
| CN | 201893434 | 7/2011 |
| CN | 102984831 | 3/2013 |
| CN | 104378935 | 2/2015 |
| CN | 204335274 | 5/2015 |
| CN | 205430854 | 8/2016 |
| WO | WO2014075429 | 5/2014 |

OTHER PUBLICATIONS

International Search Report issued in International Application No. PCT/CN2016/108867 dated Feb. 24, 2017, 12 pages.

REMOTE RADIO APPARATUS AND COMPONENT THEREOF

CROSS REFERENCE TO RELATED APPLICATION

This application is a continuation of U.S. patent application Ser. No. 16/002,608, filed on Jun. 7, 2018, which is a continuation of International Patent Application No. PCT/CN2016/108867, filed on Dec. 7, 2016, which claims priority to Chinese Patent Application No. 201510896866.X, filed on Dec. 8, 2015, and Chinese Patent Application No. 201521010074.X, filed on Dec. 8, 2015. All of the aforementioned patent applications are hereby incorporated by reference in their entireties.

TECHNICAL FIELD

The present application relates to the field of communications device technologies, and specifically, to a remote radio apparatus and a component of the remote radio apparatus.

BACKGROUND

A remote radio unit (RRU) is a component of a base station, and is mainly configured to: perform downlink frequency conversion, filtering, and linear power amplifying on a baseband signal, and transfer the processed baseband signal to an antenna feeder. For uplink, the RRU performs filtering and low noise amplifying on a received uplink signal from a mobile terminal side, further performs amplifying, filtering, and down frequency conversion on a small radio frequency signal, and then completes analog-to-digital conversion, digital intermediate frequency processing, and the like.

From a perspective of a structure, the RRU includes an optical module (Small Form-factor Pluggables, SFP), a RRU mainboard, and a heat sink. The SFP and the RRU mainboard are disposed on a same big board and share the heat sink.

A temperature specification of a key device of the mainboard is usually from 105° C. to 125° C. (including 105° C. and 125° C.). However, a temperature specification of the SFP is usually from 85° C. to 90° C. (including 85° C. and 90° C.). A heat consumption ranging from 1 W to 2 W (including 1 W and 2 W) of the SFP causes a relatively small temperature rise. However, a heat consumption of the mainboard is large, and the large heat consumption causes a temperature rise of the heat sink at the SFP. Consequently, a temperature of the SFP exceeds the requirement of the specification.

SUMMARY

To resolve a problem in the prior art that heat dissipation of an SFP is poor and a temperature of the SFP exceeds a requirement of a specification, embodiments of the present application provide a remote radio apparatus RRU, so that a heat conductivity path between an optical module heat sink and a mainboard heat sink is extended, a temperature of the optical module heat sink is reduced, and impact on a temperature of an optical module is weakened, thereby controlling the temperature of the optical module within a range required by the specification. The embodiments of the present application further provide a corresponding component of the RRU.

A first aspect of the present application provides a remote radio apparatus RRU, including: a body, a mainboard, a mainboard heat sink, a maintenance cavity, an optical module, and an optical module heat sink, where the maintenance cavity and the optical module heat sink are integrally connected;

the optical module is mounted on a bottom surface of the optical module heat sink;

the maintenance cavity and the optical module heat sink are mounted on a side surface of the body; and the mainboard heat sink is mounted on and cover the mainboard, the mainboard heat sink and the mainboard are mounted on a front surface of the body, and the mainboard heat sink and the optical module heat sink are spaced by a preset distance.

With reference to the first aspect, in a first possible implementation, support and connection between the mainboard heat sink and the optical module heat sink are implemented by using a plurality of support pieces, and the plurality of support pieces are configured to keep space between the mainboard heat sink and the optical module heat sink.

With reference to the first possible implementation of the first aspect, in a second possible implementation, a first waterproof rubber strip is mounted at a gap between the mainboard heat sink and the optical module heat sink.

With reference to the first aspect, or the first or the second possible implementation of the first aspect, in a third possible implementation, the maintenance cavity includes a cable outlet cavity and a cover of the cable outlet cavity, and the cover of the cable outlet cavity is connected to the maintenance cavity by using a connecting piece.

With reference to the third possible implementation of the first aspect, in a fourth possible implementation, a second waterproof rubber strip is mounted around the cover of the cable outlet cavity.

A second aspect of the present application provides a component of a remote radio apparatus RRU. The component includes a maintenance cavity, an optical module, and an optical module heat sink, where the maintenance cavity and the optical module heat sink are integrally connected;

the optical module is mounted on a bottom surface of the optical module heat sink;

the maintenance cavity and the optical module heat sink are mounted on a side surface of the body; and a mainboard of the RRU is mounted on a front surface of the body, a mainboard heat sink is mounted on and cover the mainboard, and the mainboard heat sink and the optical module heat sink are spaced by a preset distance.

With reference to the second aspect, in a first possible implementation, support and connection between the mainboard heat sink and the optical module heat sink are implemented by using a plurality of support pieces, and the plurality of support pieces are configured to keep space between the mainboard heat sink and the optical module heat sink.

With reference to the first possible implementation of the second aspect, in a second possible implementation, a first waterproof rubber strip is mounted at a gap between the mainboard heat sink and the optical module heat sink.

With reference to the second aspect, or the first or the second possible implementation of the second aspect, in a third possible implementation, the maintenance cavity includes a cable outlet cavity and a cover of the cable outlet cavity, and the cover of the cable outlet cavity is connected to the maintenance cavity by using a connecting piece.

With reference to the third possible implementation of the second aspect, in a fourth possible implementation, a second waterproof rubber strip is mounted around the cover of the cable outlet cavity.

Compared with the prior art in which a temperature of the optical module exceeds a specification because the optical module and the mainboard share a heat sink, according to the RRU provided in the embodiments of the present application, the optical module heat sink is separated from the mainboard heat sink, so that a heat conductivity path between the optical module heat sink and the mainboard heat sink is extended, a temperature of the optical module heat sink is reduced, and impact on the temperature of the optical module is weakened, thereby controlling the temperature of the optical module within a range required by the specification.

BRIEF DESCRIPTION OF DRAWINGS

To describe the technical solutions in the embodiments of the present application more clearly, the following briefly describes the accompanying drawings required for describing the embodiments. Apparently, the accompanying drawings in the following description show merely some embodiments of the present application, and a person skilled in the art may still derive other drawings from these accompanying drawings without creative efforts.

DESCRIPTION OF EMBODIMENTS

An embodiment of the present application provides a remote radio apparatus RRU, so that a heat conductivity path between an optical module heat sink and a mainboard heat sink can be extended, a temperature of the optical module heat sink can be reduced, and impact on a temperature of an optical module can be weakened, thereby controlling the temperature of the optical module within a range required by a specification. An embodiment of the present application further provides a corresponding component of the RRU. Detailed descriptions are separately provided below.

The following clearly describes the technical solutions in the embodiments of the present application with reference to the accompanying drawings in the embodiments of the present application. Apparently, the described embodiments are merely some but not all of the embodiments of the present application. All other embodiments obtained by a person skilled in the art based on the embodiments of the present application without creative efforts shall fall within the protection scope of the present application.

Figure 1:
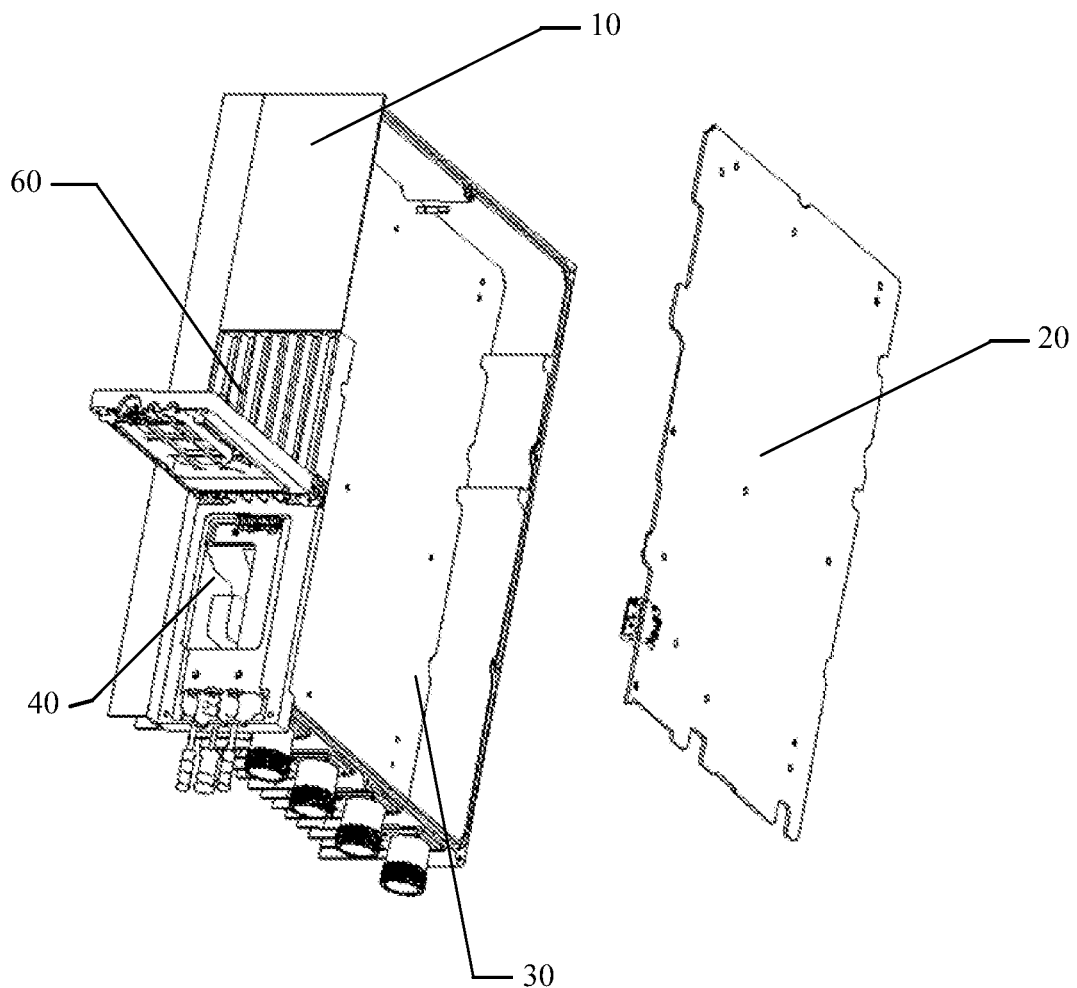
FIG. 1 is a schematic structural diagram of a RRU according to an embodiment of the present application.

FIG. 1 is a schematic structural diagram of a RRU according to an embodiment of the present application.

Referring to FIG. 1, an embodiment of a remote radio apparatus RRU provided in the embodiments of the present application includes:

a body 10, a mainboard 20, a mainboard heat sink 30, a maintenance cavity 40, an optical module 50 (which is mounted on a bottom surface of the optical module heat sink 60, not shown in FIG. 1), and an optical module heat sink 60, where the maintenance cavity 40 and the optical module heat sink 60 are integrally connected, the optical module 50 is mounted on the bottom surface of the optical module heat sink 60, the maintenance cavity 40 and the optical module heat sink 60 are mounted on a side surface of the body, the mainboard heat sink 30 is mounted on and cover the mainboard 20, that is, the mainboard 20 is fixedly mounted on the mainboard heat sink 30, the mainboard heat sink 30 and the mainboard 20 are mounted on a front surface of the body, the optical module heat sink 60 and the mainboard heat sink 30 are perpendicular to each other or tend to be perpendicular to each other, and the mainboard heat sink 30 and the optical module heat sink 60 are spaced by a preset distance.

In this embodiment of the present application, the front surface may be understood as a surface having a larger area, and the side surface may be understood as a surface having a smaller area. Actually, this only intends to indicate that the optical module heat sink 60 and the mainboard heat sink 30 are respectively located on different planes.

According to the RRU provided in this embodiment of the present application, the optical module heat sink 60 is separated from the mainboard heat sink 30, so that a heat conductivity path between the optical module heat sink 60 and the mainboard heat sink 30 is extended, a temperature of the optical module heat sink 60 is reduced, and impact on the temperature of the optical module 50 is weakened, thereby controlling the temperature of the optical module within a range required by a specification.

Figure 2:
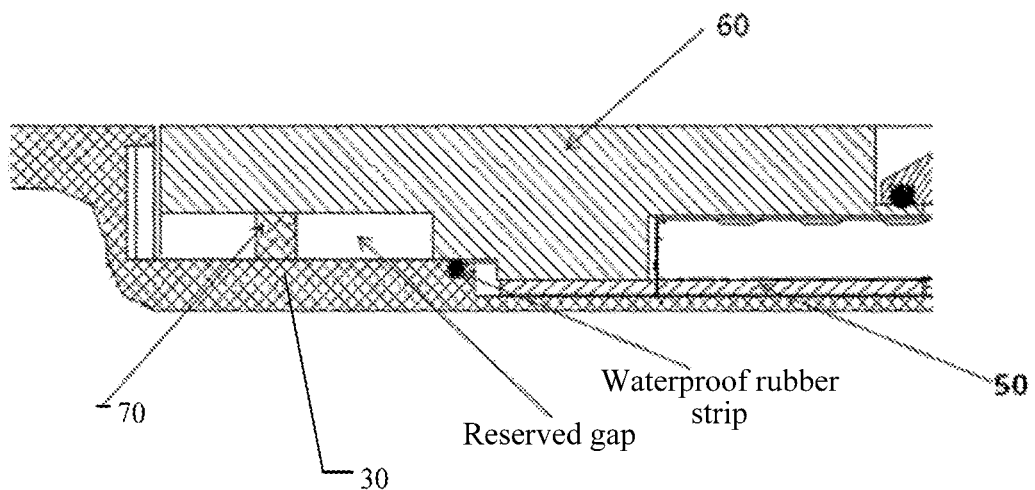
FIG. 2 is a sectional view of a connection relationship between a mainboard heat sink and an optical module heat sink according to an embodiment of the present application.

FIG. 2 is a sectional view of a connection relationship between a mainboard heat sink and an optical module heat sink according to an embodiment of the present application.

Referring to FIG. 2, support and connection between the mainboard heat sink 30 and the optical module heat sink 60 are implemented by using a plurality of support pieces 70, thereby keeping space between the mainboard heat sink 30 and the optical module heat sink 60.

The support piece 70 may be a cylindrical screw or a boss, or may be a support piece of another shape. The shape of the support piece is not specifically limited in this embodiment of the present application.

The support and connection between the mainboard heat sink 30 and optical module heat sink 60 are implemented by using the cylinder screw or the boss, so that a contact area between the mainboard heat sink 30 and optical module heat sink 60 can be reduced, thereby reducing a heat conductivity area and further controlling the temperature of optical module heat sink 60. Therefore, the temperature of the optical module 50 is controlled.

A waterproof rubber strip is mounted at a gap between the mainboard heat sink 30 and the optical module heat sink 60. The waterproof rubber strip can prevent water from entering the optical module by passing through the gap between the mainboard heat sink 30 and optical module heat sink 60.

Figure 3:
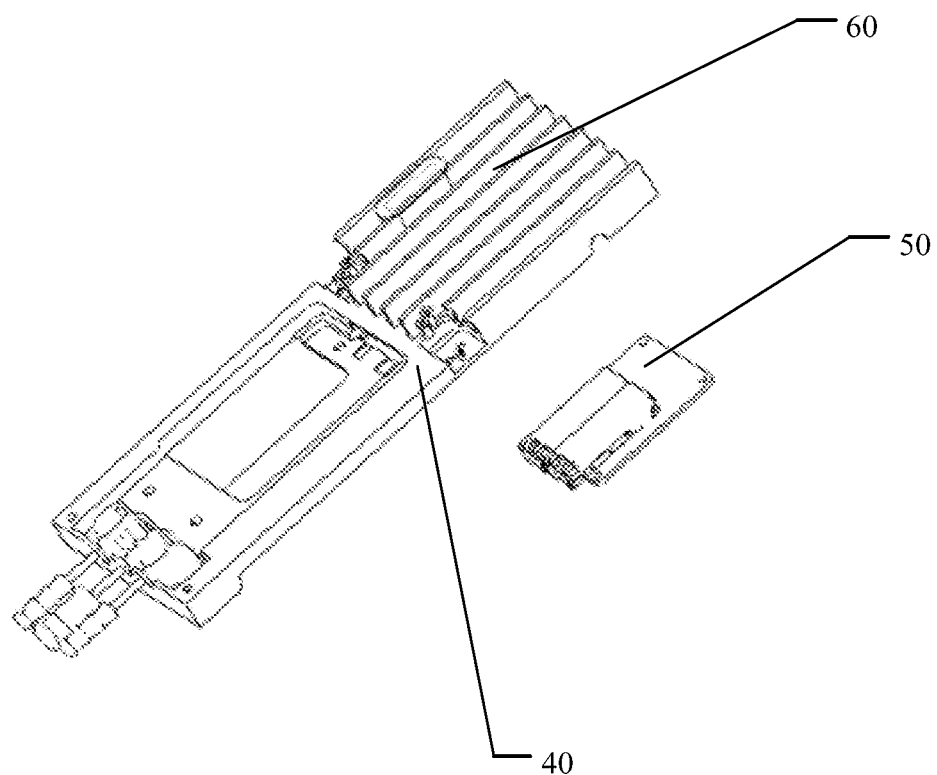
FIG. 3 is a structural diagram of a component of a RRU according to an embodiment of the present application.

FIG. 3 is a structural diagram of a component of a RRU according to an embodiment of the present application.

The component of the RRU provided in this embodiment of the present application includes: a maintenance cavity 40, an optical module 50, and an optical module heat sink 60. The maintenance cavity 40 and the optical module heat sink 60 are integrally connected, and the optical module 50 is mounted on a bottom surface of the optical module heat sink 60.

Figure 4:
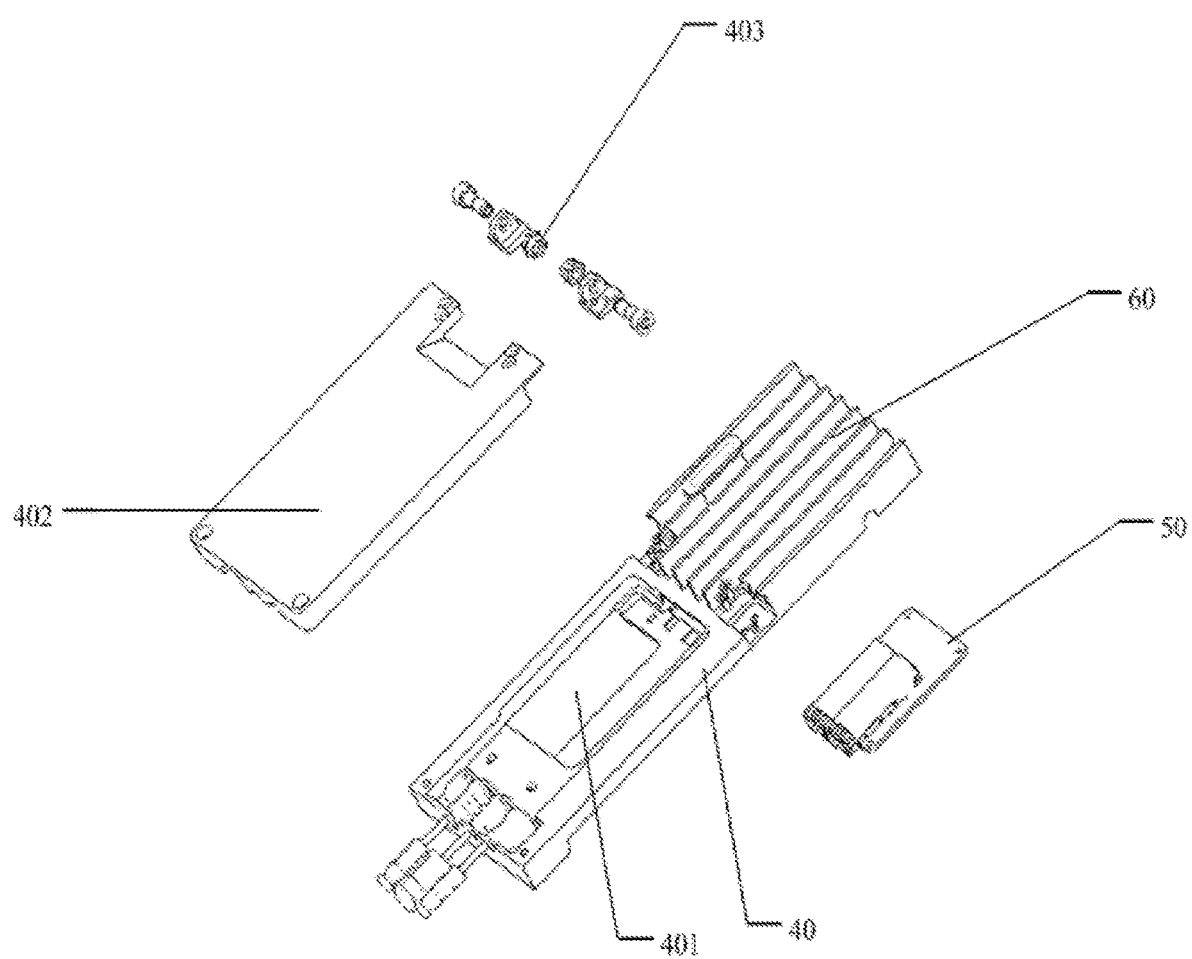
FIG. 4 is an exploded structural diagram of a component of a RRU according to an embodiment of the present application.

FIG. 4 is a schematic exploded structural diagram of a component of a RRU according to an embodiment of the present application.

Referring to FIG. 4, the component of the RRU according to this embodiment of the present application includes: a maintenance cavity 40, an optical module 50, and an optical module heat sink 60. The maintenance cavity 40 and the optical module heat sink 60 are integrally connected, and the optical module 50 is mounted on a bottom surface of the optical module heat sink 60. The maintenance cavity 40 includes a cable outlet cavity 401 and a cover 402 of the cable outlet cavity, and the cover 402 of the cable outlet cavity is connected to the maintenance cavity 40 by using a connecting piece 403. When the cover 402 of the cable outlet cavity is closed, the cable outlet cavity 401 can be closed, so that the cable outlet cavity 401 can be protected. When the cover 402 of the cable outlet cavity is opened, a cable can be led out.

The connecting piece 403 may be a part such as a micro rotating shaft, a clip, or a screw that can implement a connection function.

Figure 5:
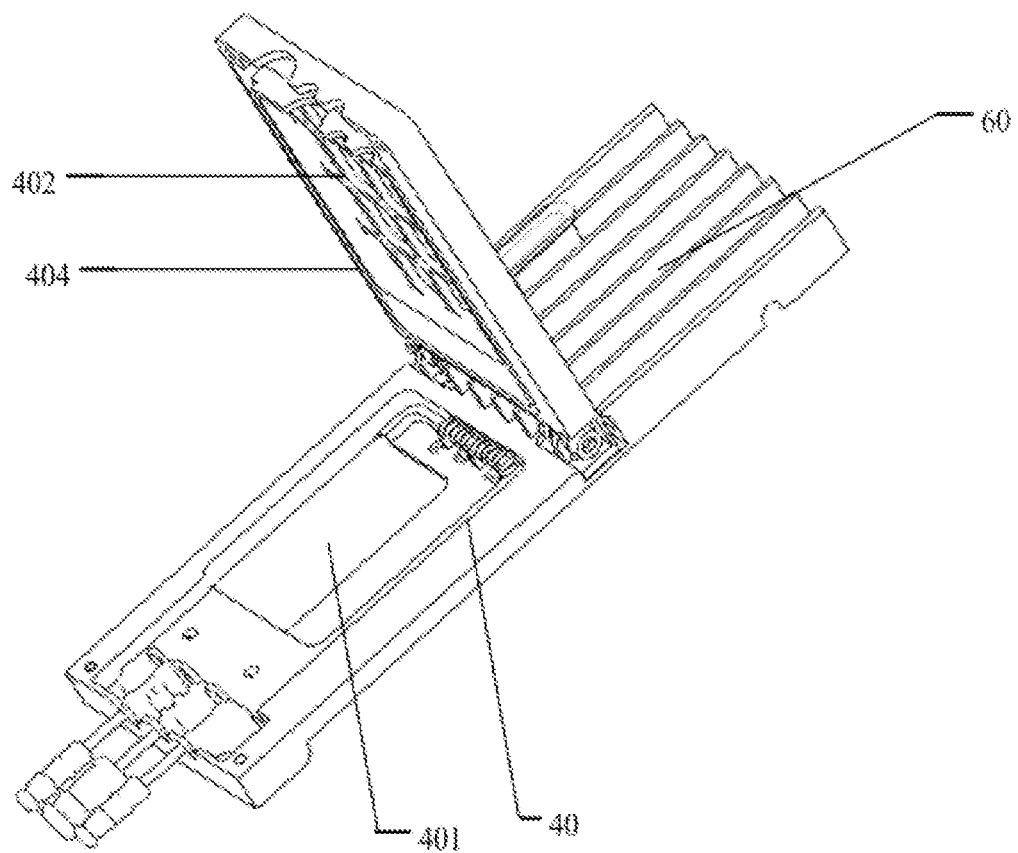
FIG. 5 is an overall structural diagram of a component of a RRU according to an embodiment of the present application.

FIG. 5 is an overall schematic structural diagram of a component of a RRU according to an embodiment of the present application.

Referring to FIG. 5, a waterproof rubber strip 404 is mounted around the cover 402 of the cable outlet cavity. The waterproof rubber strip 404 is waterproof, so that a cable in the cable outlet cavity 401 is protected.

According to the component of the RRU provided in this embodiment of the present application, the optical module heat sink is separated from the mainboard heat sink, so that a heat conductivity path between the optical module heat sink and the mainboard heat sink is extended, a temperature of the optical module heat sink is reduced, and impact on the temperature of the optical module is weakened, thereby controlling the temperature of the optical module within a range required by a specification.

The remote radio apparatus RRU and the component thereof provided in the embodiments of the present application are described in detail above. The principles and implementations of the present application are described by using specific examples in this specification. The foregoing descriptions of the embodiments are only intended to help understand the method and core idea of the present application. In addition, a person of ordinary skill in the art can make modifications to the specific implementations and the application range according to the idea of the present application. In conclusion, the content of specification shall not be understood as a limitation to the present application.

What is claimed:

1. A remote radio apparatus (RRU), comprising: a mainboard, a mainboard heat sink, a maintenance cavity, an optical module, and an optical module heat sink, wherein:
   the maintenance cavity and the optical module heat sink are integrally connected;
   the optical module is mounted on a bottom surface of the optical module heat sink;
   the maintenance cavity and the optical module heat sink are mounted on a side surface of the RRU; and
   the mainboard heat sink is mounted on and covers the mainboard, wherein the mainboard heat sink and the mainboard are mounted on a front surface of the RRU, and wherein the mainboard heat sink and the optical module heat sink are spaced by a preset distance.

2. The RRU according to claim 1, wherein support and connection between the mainboard heat sink and the optical module heat sink are implemented by using a plurality of support pieces, and wherein the plurality of support pieces are configured to keep at least a portion of the preset distance between the mainboard heat sink and the optical module heat sink.

3. The RRU according to claim 2, wherein a first waterproof rubber strip is mounted at a gap within the preset distance between the mainboard heat sink and the optical module heat sink.

4. The RRU according to claim 1, wherein the maintenance cavity comprises a cable outlet cavity and a cover of the cable outlet cavity, and wherein the cover of the cable outlet cavity is connected to the maintenance cavity by using a connecting piece.

5. The RRU according to claim 4, wherein a second waterproof rubber strip is mounted around the cover of the cable outlet cavity.

6. A component of a remote radio apparatus (RRU), wherein the component comprises a maintenance cavity, an optical module, and an optical module heat sink, wherein:
   the maintenance cavity and the optical module heat sink are integrally connected;
   the optical module is mounted on a bottom surface of the optical module heat sink;
   the maintenance cavity and the optical module heat sink are mounted on a side surface of the RRU; and
   a mainboard of the RRU is mounted on a front surface of the RRU, wherein a mainboard heat sink is mounted on and covers the mainboard, and wherein the mainboard heat sink and the optical module heat sink are spaced by a preset distance.

7. The component according to claim 6, wherein support and connection between the mainboard heat sink and the optical module heat sink are implemented by using a plurality of support pieces, and wherein the plurality of support pieces are configured to keep at least a portion of the preset distance between the mainboard heat sink and the optical module heat sink.

8. The component according to claim 7, wherein a first waterproof rubber strip is mounted at a gap within the preset distance between the mainboard heat sink and the optical module heat sink.

9. The component according to claim 6, wherein the maintenance cavity comprises a cable outlet cavity and a cover of the cable outlet cavity, and wherein the cover of the cable outlet cavity is connected to the maintenance cavity by using a connecting piece.

10. The component according to claim 9, wherein a second waterproof rubber strip is mounted around the cover of the cable outlet cavity.

11. A base station, comprising a remote radio apparatus (RRU), the RRU comprising:
   a mainboard, a mainboard heat sink, a maintenance cavity, an optical module, and an optical module heat sink, wherein:
   the maintenance cavity and the optical module heat sink are integrally connected;
   the optical module is mounted on a bottom surface of the optical module heat sink;
   the maintenance cavity and the optical module heat sink are mounted on a side surface of the RRU; and
   the mainboard heat sink is mounted on and covers the mainboard, wherein the mainboard heat sink and the mainboard are mounted on a front surface of the RRU, and wherein the mainboard heat sink and the optical module heat sink are spaced by a preset distance.

12. The base station according to claim 11, wherein support and connection between the mainboard heat sink and the optical module heat sink are implemented by using a plurality of support pieces, and wherein the plurality of support pieces are configured to keep at least a portion of the preset distance between the mainboard heat sink and the optical module heat sink.

13. The base station according to claim 12, wherein a first waterproof rubber strip is mounted at a gap within the preset distance between the mainboard heat sink and the optical module heat sink.

14. The base station according to claim 11, wherein the maintenance cavity comprises a cable outlet cavity and a cover of the cable outlet cavity, and wherein the cover of the cable outlet cavity is connected to the maintenance cavity by using a connecting piece.

15. The base station according to claim 14, wherein a second waterproof rubber strip is mounted around the cover of the cable outlet cavity.

* * * * *